United States Patent
Glancy et al.

(10) Patent No.: US 11,698,842 B2
(45) Date of Patent: *Jul. 11, 2023

(54) EFFICIENT AND SELECTIVE SPARING OF BITS IN MEMORY SYSTEMS

(71) Applicant: International Business Machines Corporation, Armonk, NY (US)

(72) Inventors: Stephen Glancy, Yorktown, VA (US); Kyu-hyoun Kim, Chappaqua, NY (US); Warren E. Maule, Cedar Park, TX (US); Kevin M. Mcilvain, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/496,399

(22) Filed: Oct. 7, 2021

(65) Prior Publication Data

US 2022/0027243 A1 Jan. 27, 2022

Related U.S. Application Data

(63) Continuation of application No. 16/828,380, filed on Mar. 24, 2020, now Pat. No. 11,182,262, which is a (Continued)

(51) Int. Cl.
*G06F 11/16* (2006.01)
*G11C 29/42* (2006.01)
(Continued)

(52) U.S. Cl.
CPC ...... *G06F 11/1666* (2013.01); *G06F 11/1068* (2013.01); *G11C 29/42* (2013.01);
(Continued)

(58) Field of Classification Search
CPC .. G06F 11/1068; G06F 11/1666; G11C 29/42; G11C 29/44; G11C 29/52; G11C 29/70; G11C 29/76; G11C 2029/1204
See application file for complete search history.

(56) References Cited

U.S. PATENT DOCUMENTS

| | | | |
|---|---|---|---|
| 4,460,998 | A | 7/1984 | Yamada et al. |
| 4,594,660 | A | 6/1986 | Guenthner et al. |

(Continued)

FOREIGN PATENT DOCUMENTS

| | | |
|---|---|---|
| CN | 101339526 A | 1/2009 |
| CN | 104572517 A | 4/2015 |

(Continued)

OTHER PUBLICATIONS

Kim, J., et al., "PAI: A Lightweight Mechanism for Single-Node Memory Recovery in DSM Servers," 13th IEEE Pacific Rim Intl Symp on Dependable Computing (PRDC'07), Dec. 2007, 8 pages.

(Continued)

*Primary Examiner* — Joseph R Kudirka
(74) *Attorney, Agent, or Firm* — Scully, Scott, Murphy & Presser, P.C.

(57) ABSTRACT

A memory system for storing data is disclosed, the memory system including a plurality of memory devices configured to store data, each memory device having a plurality of bits, the memory devices configured and associated to work together as a rank to respond to a request; a memory control circuit associated with the plurality of memory devices and configured to output command and control signals to the plurality of memory devices; a detector for detecting a bit error in an operation; and a controller for remapping the bit error to a spare bit lane in response to the detector detecting the bit error.

19 Claims, 6 Drawing Sheets

Related U.S. Application Data continuation of application No. 15/875,136, filed on Jan. 19, 2018, now Pat. No. 10,671,497.

(51) Int. Cl.
  *G11C 29/00* (2006.01)
  *G06F 11/10* (2006.01)
  *G11C 29/44* (2006.01)
  *G11C 29/52* (2006.01)
  *G11C 29/12* (2006.01)

(52) U.S. Cl.
  CPC .............. *G11C 29/44* (2013.01); *G11C 29/52* (2013.01); *G11C 29/70* (2013.01); *G11C 29/76* (2013.01); *G11C 2029/1204* (2013.01)

(56) References Cited

U.S. PATENT DOCUMENTS

| | | | |
|---|---|---|---|
| 5,617,365 | A | 4/1997 | Horiguchi et al. |
| 6,237,076 | B1 | 5/2001 | Gaertner et al. |
| 6,366,998 | B1 | 4/2002 | Mohamed |
| 6,418,068 | B1 | 7/2002 | Raynham |
| 6,711,602 | B1 | 3/2004 | Bhandal et al. |
| 6,760,856 | B1 | 7/2004 | Borkenhagen et al. |
| 7,184,916 | B2 | 2/2007 | Resnick et al. |
| 7,334,201 | B1 | 2/2008 | Sanghavi et al. |
| 7,447,066 | B2 | 11/2008 | Conley et al. |
| 7,465,185 | B2 | 12/2008 | Tyler |
| 7,712,010 | B2 * | 5/2010 | Dell ............... H04L 1/0045 370/227 |
| 8,090,976 | B2 | 1/2012 | Maciver et al. |
| 8,412,761 | B2 | 4/2013 | Yoshida |
| 8,615,679 | B2 | 12/2013 | Smith et al. |
| 8,635,487 | B2 | 1/2014 | Gower et al. |
| 9,477,550 | B2 | 10/2016 | Goodman et al. |
| 9,715,424 | B1 | 7/2017 | Ware |
| 9,804,851 | B2 | 10/2017 | Grisenthwaite et al. |
| 10,261,856 | B2 | 4/2019 | Glancy et al. |
| 2006/0036827 | A1 | 2/2006 | Dell et al. |
| 2007/0239970 | A1 | 10/2007 | Liao et al. |
| 2008/0005644 | A1 | 1/2008 | Dell |
| 2008/0313424 | A1 | 12/2008 | Gschwind |
| 2009/0198966 | A1 | 8/2009 | Gschwind et al. |
| 2010/0269000 | A1 * | 10/2010 | Lee ............... G11C 29/52 711/E12.001 |
| 2012/0166904 | A1 | 6/2012 | Bandholz |
| 2013/0246761 | A1 | 9/2013 | Derby et al. |
| 2014/0325315 | A1 | 10/2014 | Warnes et al. |
| 2014/0351629 | A1 | 11/2014 | Ware et al. |
| 2015/0006855 | A1 | 1/2015 | Gschwind et al. |
| 2015/0121047 | A1 | 4/2015 | Bradbury et al. |
| 2016/0062860 | A1 | 3/2016 | Yang et al. |
| 2016/0070574 | A1 | 3/2016 | Boersma et al. |
| 2016/0232063 | A1 | 8/2016 | Das et al. |
| 2017/0109093 | A1 | 4/2017 | Chu et al. |
| 2019/0205225 | A1 | 7/2019 | Kim et al. |

FOREIGN PATENT DOCUMENTS

| | | |
|---|---|---|
| JP | 2006048688 A | 2/2006 |
| WO | 2013115783 A1 | 8/2013 |

OTHER PUBLICATIONS

"Memory for Dell PowerEdge 12th Generation Servers," White paper, Dell Inc., Rev 1.0, Feb. 2012, 16 pages.

International Search Report dated Apr. 29, 2019 received in corresponding foreign application PCT/IB2019/050299, 9 pages.

List of IBM Patents or Patent Applications Treated as Related, dated Mar. 24, 2020, 2 pages.

Office Action dated Nov. 25, 2020 received in U.S. Appl. No. 16/563,091, 45 pages.

IBM, "POWER8 Processor User's Manual for the Single-Chip Module", International Business Machines Corporation, Mar. 16, 2016, pp. 31-35, 135, 149, 266-268 and 449-450.

IBM, "IBM POWER8 processor core Microarchitecture", International Business Machines Corporation, Jan./Feb. 2015, pp. 2: 1 to 2:2, vol. 59 No. 1.

Office Action dated Dec. 21, 2020 received in U.S. Appl. No. 16/563,015, 20 pages.

List of IBM Patents or Patent Applications Treated as Related, dated Oct. 7, 2021, 2 pages.

English-language translation of the Japanese Office Action dated Jun. 10, 2022, received in a corresponding foreign application, 6 pages.

Notice of Reasons for Refusal dated Dec. 16, 2022, received in a corresponding foreign application, 2 pages.

\* cited by examiner

511

EFFICIENT AND SELECTIVE SPARING OF BITS IN MEMORY SYSTEMS

BACKGROUND

The present invention relates to computer architecture, processing and memory systems, and more specifically to Recoverability, Availability and Serviceability (RAS) needs including efficient and selective sparing of bits in memory systems/subsystems.

With recent advancement of information technology and wide use of the internet to store and process information, more and more demands are placed on the acquisition, processing, storage and dissemination of information by computing systems. Computing systems are being developed to increase the speed at which computers are able to execute increasingly complex applications for business, personal use, and entertainment. Overall computer system performance is affected by each of the key elements of the computer structure, including the performance/structure of the processors, any memory caches, input/output (I/O) subsystems, efficiency of the memory control functions, the performance of the memory devices and systems, and any associated memory interface elements, and the type and structure of the memory interconnect interfaces.

The constantly increasing speed of processors which execute increasingly complex applications places more rigorous performance demands on all of the other subsystems in the computer, including the memory subsystem, where data is stored, accessed, and updated numerous times during the operation of an application. The time consumed by memory read/write operations is a major factor in the ultimate speed and efficiency of a computer system. The memory subsystem of most computers is normally operated by a memory controller. The task of memory controllers is to move data between the computer's memory subsystem and its one or more processors as quickly and efficiently as possible. In many memory subsystems, the memory controller may control multiple memory devices. The memory devices may be arranged in ranks and/or channels. A computer's memory subsystem often comprises memory modules, usually one or more dual in-line memory modules (DIMMs) that include several memory devices, e.g., dynamic random access memory (DRAM) devices. The DIMMs may have one or more ranks and channels of memory devices.

Computing demands require the ability to access an increasing number of higher density memory devices at faster and faster access speeds. Extensive research and development efforts are invested by the industry to create improved and or innovative solutions to maximize overall system performance by improving the memory system/subsystem design and/or structure and the methods by which the memory system/subsystem operates. Such efforts have resulted in the development of distributed memory systems, distributed buffer memory systems, registered DIMMs (RDIMMs) and load reduced DIMMs (LRDIMMs), and other systems, specifications and standards such as, for example, DDR4 and DDR5, which provide for increased memory performance.

In one example, a distributed memory system may include a plurality of memory devices, one or more Address Chips (AC), also known as memory control circuits, and a plurality of data circuits, also known as data buffer circuits or DC chips (DC). There are communication links or buses between a host processor and the memory control circuits and data buffer circuits. There is also a communication link or bus from the memory control circuits to the data buffer circuits. There are also communication links between the memory devices, e.g., DRAMS, and the memory control circuits and the data buffer circuits. Bandwidth limitations on communication links can affect performance of memory systems.

As performance of memory systems increases (e.g., speed and capacity), recoverability, availability and serviceability (RAS) are also important considerations. The RAS needs of a high end server or mainframe computer are very different from a low end personal computer. In order to increase reliability and to prevent or at least lower the risk of computer failure, different forms of error detection and correction processes have been developed. One commonly used system for error detection is the use of parity bits to detect errors. While parity bit checking works to determine single bit errors, it does not always work for determining multibit errors, and parity checking systems have no mechanism to correct data errors.

SUMMARY

The summary of the disclosure is given to aid understanding of the memory system, architectural structure, and method of storing and fetching data, and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the memory systems, architectural structure, and method of operation to achieve different effects.

In one embodiment, a memory system for storing data is disclosed, the memory system including a plurality of memory devices configured to store data, each memory device having a plurality of bits, the memory devices configured and associated to work together preferably as a rank to respond to a request; a memory control circuit associated with the plurality of memory devices and configured to output command and control signals to the plurality of memory devices; a detector for detecting a bit error in an operation; and a controller for remapping the bit error to a spare bit lane in response to the detector detecting the bit error.

In another embodiment, a memory system for storing data is disclosed, the memory system including a plurality of memory devices configured to store data, each memory device having a plurality of bits, the memory devices configured and associated to work together to perform an operation; a memory control circuit associated with the plurality of memory devices, and configured to output signals to the plurality of memory devices, the memory control circuit containing logic circuits configured to (i) detect a failing bit during an operation; (ii) rewrite data from the failing bit to, in one embodiment, a single spare bit lane; and (iii) read the data rewritten to the spare bit lane for the failing bit. In one aspect, the memory control circuit includes a memory controller configured to write the location of the failing bit to the spare bit lane, and in a further aspect, ECC for the data and location information may be written to the spare bit lane.

A method for managing bit errors in a memory subsystem is also disclosed, the method including detecting an error in a first memory bit location in a plurality of memory devices in a first operation; and remapping the data to be stored at the memory bit location where the first error was detected to a spare bit lane. In one aspect, the data to be stored in the memory bit location where the first error was detected is remapped to a spare bit in the spare bit lane. The remapping may include storing in the spare bit lane location information identifying the location of the detected bit error and error correction code for the spare bit. In one aspect, the first operation is a read operation and if an error is detected during the read operation, the method further comprises performing a write operation wherein the system, preferably the memory controller, writes the information/data from the bit location where the error was detected into the spare bit lane. In another aspect, the method includes a read operation and valid data is read from the spare bit lane that includes one bit of data, one or more bits of location information for the bit of data, and one or more bits of error correction code protecting the data bit and the location bits. In another aspect, the method includes a read operation and valid data is read from the spare bit lane that includes one spare bit where that bit is remapped into the read data by the system, preferably the memory controller, using location information stored in the spare bit lane to reconstruct the original non-spared data. In a further aspect, after remapping the faulty bit to the spare bit lane and after the system or process reads out the spare bit, the system can repair the data as appropriate.

BRIEF DESCRIPTION OF THE DRAWINGS

The various aspects, features, and embodiments of the memory system, architectural structure and its method of operation will be better understood when read in conjunction with the figures provided. Embodiments are provided in the figures for the purpose of illustrating aspects, features, and/or various embodiments of the memory system, architectural structure, and method of operation, but the claims should not be limited to the precise arrangement, structures, features, aspects, embodiments or devices shown, and the arrangements, structures, subassemblies, features, aspects, embodiments, methods, and devices shown may be used singularly or in combination with other arrangements, structures, subassemblies, features, aspects, embodiments, methods and devices.

DETAILED DESCRIPTION

The following description is made for illustrating the general principles of the invention and is not meant to limit the inventive concepts claimed herein. In the following detailed description, numerous details are set forth in order to provide an understanding of the memory system, architectural structure, and method of operation, however, it will be understood by those skilled in the art that different and numerous embodiments of the memory system, architectural structure, and method of operation may be practiced without those specific details, and the claims and invention should not be limited to the embodiments, subassemblies, features, processes, methods, aspects, features, or details specifically described and shown herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified.

Figure 1:
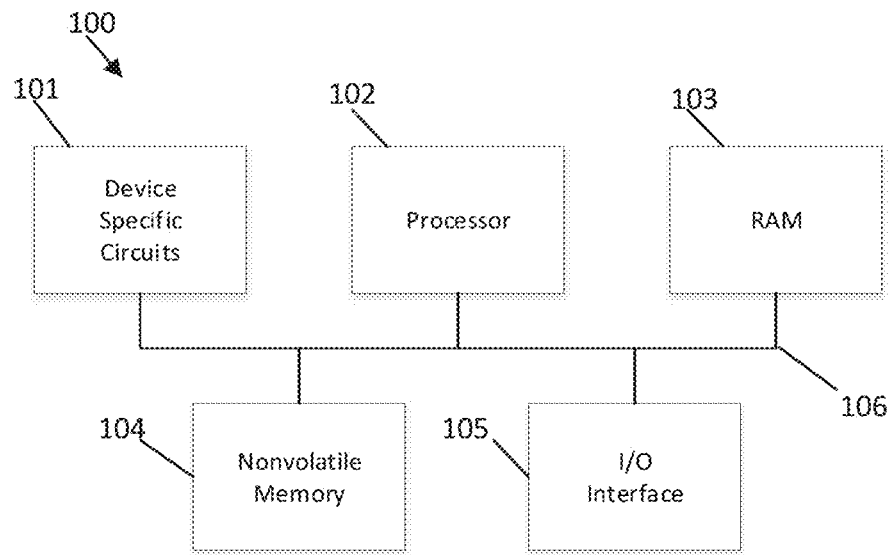
FIG. 1 depicts a general computing or data processing system.

A computing or data processing system 100 suitable for storing and/or executing program code may take many forms and in one embodiment may include at least one processor 102, which may be or be part of a controller, coupled directly or indirectly to memory devices or elements through a system bus 106, as shown in FIG. 1. Computing system 100 in FIG. 1 is shown with a processor 102, Random Access Memory (RAM) 103, nonvolatile memory 104, device specific circuits 101, and I/O interface 105. Alternatively, the RAM 103 and/or nonvolatile memory 104 may be contained in the processor 102 as could the device specific circuits 101 and I/O interface 105. The processor 102 may comprise, for example, an off-the-shelf microprocessor, custom processor, Field Programmable Gate Array (FPGA), Application Specific Integrated Circuit (ASIC), discrete logic, etc. The RAM 103 is typically used to hold variable data, stack data, executable instructions, etc., and may include Dynamic Random Access Memory or DRAM. In one embodiment, the RAM 103 may comprise Double Data Rate (DDR) synchronous DRAM or SDRAM. The RAM may include memory devices arranged on a module, such as, for example, Dual Inline Memory Modules, also known as DIMMs.

According to various approaches, the nonvolatile memory 104 may comprise any type of nonvolatile memory such as, but not limited to, Electrically Erasable Programmable Read Only Memory (EEPROM), flash Programmable Read Only Memory (PROM), battery backup RAM, hard disk drives, etc. The nonvolatile memory 104 is typically used to hold the executable firmware and any nonvolatile data containing programming instructions that can be executed to cause the processor 102 to perform certain functions.

In some embodiments, the I/O interface 105 may include a communication interface that allows the processor 102 to communicate with devices external to the controller. Examples of the communication interface may comprise, but are not limited to, serial interfaces such as RS-232, USB (Universal Serial Bus), Small Computer Systems Interface (SCSI), RS-422 or a wireless communication interface such as Wi-Fi, Bluetooth, near-field communication (NFC) or other wireless interfaces. The computing system 100 may communicate with an external device via the communication interface 105 in any communication protocol such as Automation/Drive Interface (ADI).

Figure 2:
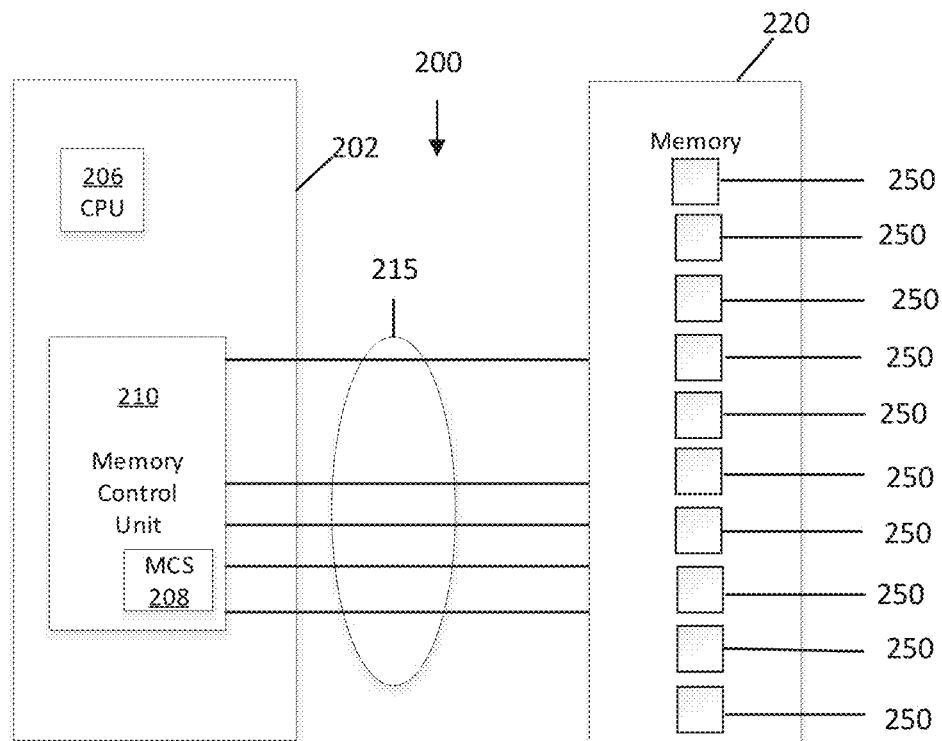
FIG. 2 depicts a computing or processing system including a memory subsystem in accordance with one embodiment.

FIG. 2 depicts an exemplary processing system 200 that may be part of a larger computer system structure or network. The processing system 200 includes a control processor system or processor 202, which is a processing subsystem that includes at least one processor unit (CPU) or microprocessor 206 that may be configured to interface with a Memory Control Unit (MCU) 210. The processor or CPU 206 may be a module that processes read, write, and configuration requests from a system controller (not depicted). The processor 206 may be a multi-core processor. The MCU 210 may include a memory controller synchronous (MCS) 208, also referred to as a memory controller, that controls communication with one or more memory devices 250 (not shown in FIG. 1) in a memory subsystem 220. The MCU 210 and the MCS 208 may include one or more processing circuits, or processing may be performed by or in conjunction with the processor 206. The control processor system 202 communicates with the memory subsystem 220 through a communications bus 215. Control processor system 202, processor or CPU 206, memory control unit 210, and MCS 208, individually and collectively, may be referred to herein as the Host. The Host as used herein is used broadly to refer to a processor, controller or device that sends and receives command and/or control signals to a memory system or subsystem. The Host may also send and receive data signals from a memory system or subsystem.

Systems, architecture, and/or methods of managing errors in a memory system or subsystem are disclosed. In one embodiment, a system, architectural structure, and/or method of using unused or spare bits in a memory channel or rank, that includes memory devices for RAS capabilities (e.g., error correction code (ECC)), is disclosed. In one aspect, the system, architecture, and/or method permits the remapping of any bit in a transaction or operation, e.g., a read or write operation, to be mapped to a spare bit lane. A bit in every transaction, e.g., read or write operation, in one embodiment can be mapped or rewritten to the spare bit lane, and the bit selection can remain the same or change with each transaction or operation. The bit selected for remapping to the spare, e.g., because of a bit error or failure, can be independent of the burst transaction or operation. And, in one embodiment, the remapping information, e.g., the data and the location of the bad or faulty bit, may be covered by error correction code (ECC). The system, architecture, and method of mapping a bit to a spare bit lane is advantageous where a memory channel has various bits failing across multiple memory devices, which may often be the case. The system, architecture, and method of remapping a bit to a spare bit lane is also more efficient than current sparing techniques, which remap an entire data line (DQ) to a spare data line (DQ).

The system, architecture, and method of sparing bits to an unused bit lane according to one embodiment may be controlled and performed by a memory controller with simple logic. The process and system may be implemented in one aspect with no or minimal changes to the memory channel. The method, system and architecture would work during memory operations, e.g., read or write operations, and may not require any Post Package Repair (PPR) modes. In addition, the method, system, and architecture may permit a standard DDR5 DIMM with error correction code (ECC) to have a higher level of RAS because the DDR5 dual channel DIMM in embodiments already has an extra bit on each channel. It is apparent to one skilled in the art that the advantages of this design may be applied to any system with extra bits on the bus and this technique and disclosure is not limited to DDR5. The method, system, and architecture can be implemented and employed in other configurations and embodiments as will be evident from the disclosure and teaching herein.

A computer's memory subsystem often comprises memory modules, usually one or more dual in-line memory modules (DIMMs), which usually include a plurality of memory devices, e.g., dynamic random access memory (DRAM) devices. The memory system in one embodiment may include a plurality of memory devices, one or more memory control circuits, and one or more data buffer circuits, all preferably arranged on a module as a DIMM. In one embodiment, the memory control circuit receives signals from a host processor and outputs command and control signals. The memory system may in one embodiment include a memory controller to control the flow of data going to and from the memory devices. The memory controller may also manage access to the memory devices. For access requests generated by a host, e.g., a processor, the memory controller generates one or more access commands to send to the memory devices to service the requests. The memory controller may also manage configuration and status of the memory devices in connection with managing access to memory resources. The memory controller preferably generates commands and manages access to data resources, e.g., memory devices, in a manner to maximize bandwidth utilization of the memory devices. The memory control circuit may include in one embodiment one or more registered clock drivers or RCDs. The memory control circuit may include in one embodiment, a scheduler, which may be in the form of a circuit.

The memory control circuit, e.g., the scheduler, may optimize the order of operations and instructions, and sends out command signals (e.g., instructions) to the data buffer circuits and/or the memory devices. In one embodiment, a memory controller, scheduler and/or circuit schedules fetch (read) operations, store (write) operations, and memory device, e.g., DRAM, periodical operations such as, for example, refresh operations, to optimize system performance. There may be communication links or buses for transferring data, commands, responses, and/or signals between a host (processor), the memory devices, the data buffer circuits, and/or the memory control circuits. In one embodiment, there is a communication bus or link from the memory control circuit to the data buffer circuits. In one embodiment there may also be communication buses and links between the host and the memory control circuit, and separate communication buses or links between host and the data buffer circuits. In another embodiment, there may be communication buses and links between the memory controller, which may be part of the processor and/or memory control circuit, and the memory devices. The memory system and/or architectural structure may further include a communication link or bus between the memory devices and the memory control circuit, and/or the data buffer circuit. For ease of illustration many of the communications links have been eliminated in the figures.

Figure 3:
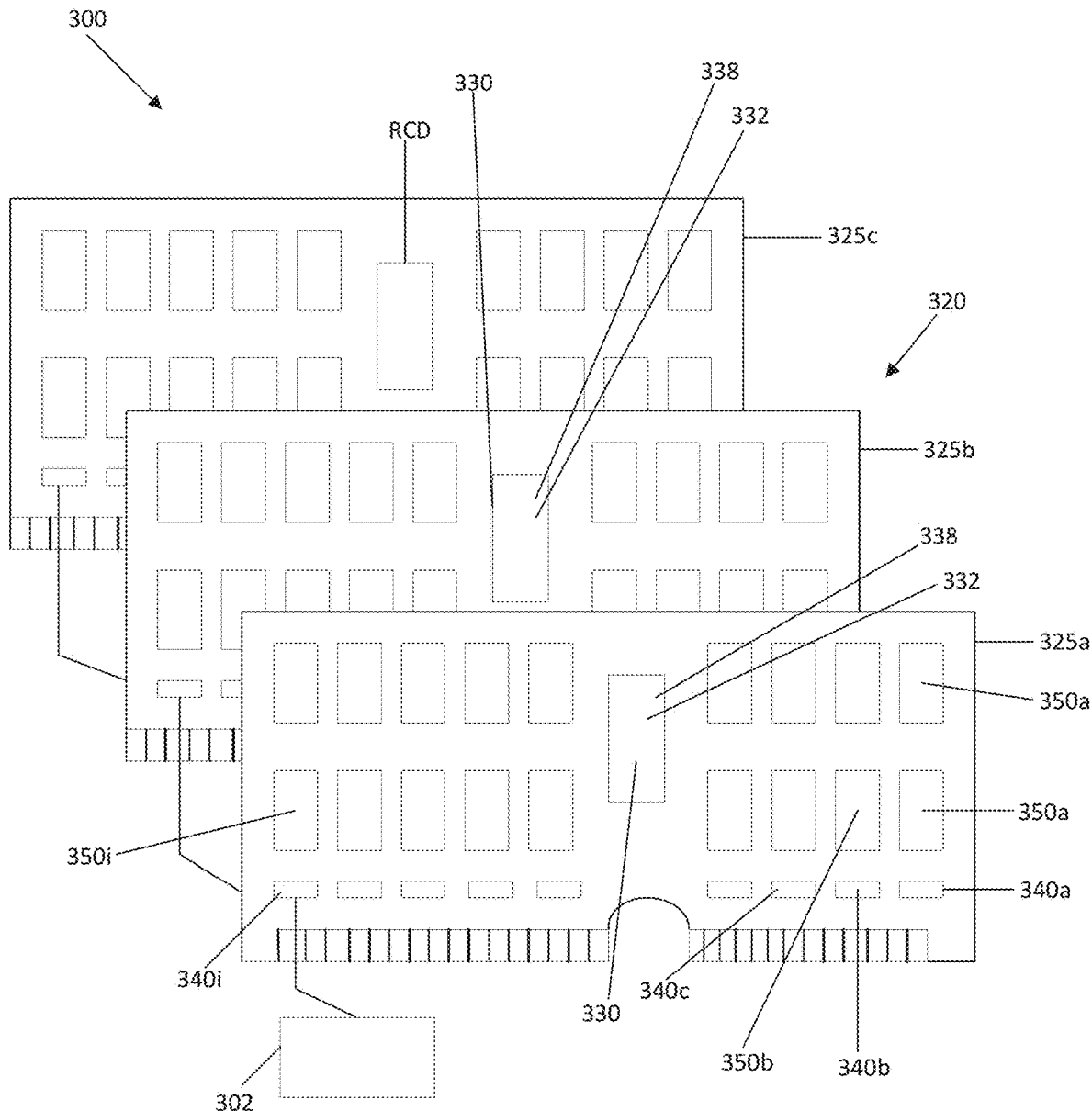
FIG. 3 depicts a memory subsystem including a buffered DIMM in accordance with an embodiment.
Figure 4:
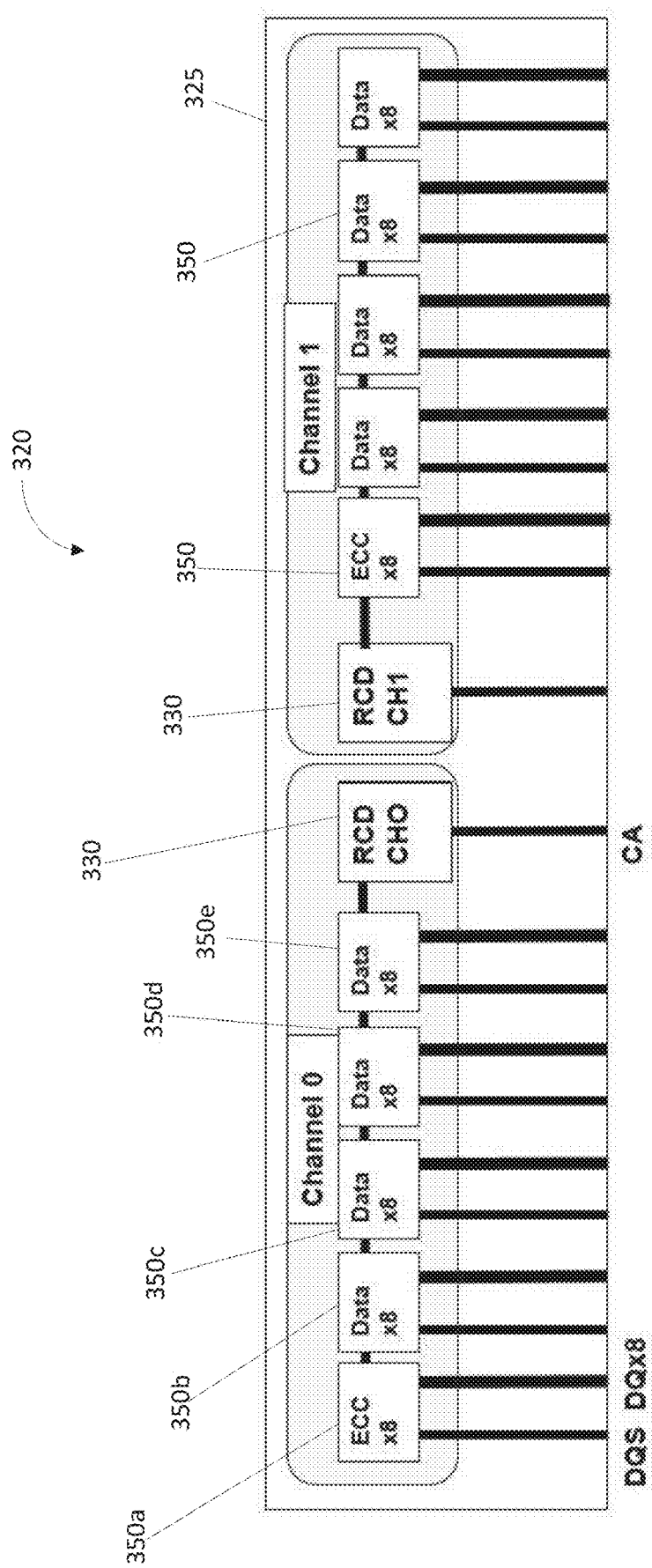
FIG. 4 depicts a dual channel DIMM in accordance with another embodiment.

FIGS. 3 and 4 depict examples of a processor-memory system 300 having a memory subsystem 320. FIG. 3 shows memory system 320 with a plurality of memory modules 325*a-c*, e.g., Dual Inline Memory Modules or DIMMs, but it will be appreciated that memory subsystem 320 may contain more or less DIMMs 325 (See e.g., FIG. 4). The example of FIG. 3 shows three memory modules 325 while the example of FIG. 4 shows one memory module 325. FIG. 3 shows a system and architecture consistent with DDR4 and FIG. 4 shows a system and architecture consistent with DDR5. FIG. 4 shows a dual channel DIMM with two RCDs, however, the function of the two RCDs shown may be contained within one RCD or multiple devices. The plurality of memory devices on the DIMMs 325 may be arranged in channels and ranks, with one or more ranks or channels on a DIMM 325, or on multiple DIMMs 325. For example, FIG. 4 shows two channels on DIMM 325. Each DIMM 325 may contain one or more volatile memory devices, e.g., DRAMs 350. The DRAMs are preferably Double Data Rate (DDR) synchronous DRAMs.

The memory devices 350 may be integrated circuits or chips and form the basic memory cells that hold bits of information. The memory cells (bits) in a memory device, e.g., DRAM, are usually arranged in banks, where each bank is an array of rows and columns. There is typically a plurality of banks in the memory devices, e.g., DRAMs. The memory devices typically have a bit width of 4, 8 or 16, which is indicated by the designation x4, x8, or x16. For example, in a x4 memory device, one beat or cycle during an operation, e.g., read or write, of the x4 memory device would access four (4) bits. For a x8 memory device, one beat or cycle during an operation of the x8 memory device would access eight (8) bits. And, for a x16 memory device, one beat or cycle during an operation, e.g., read or write, of the x16 memory device would access sixteen (16) bits.

Often, the memory devices are arranged in ranks, so that a cycle reads or writes to, multiple memory devices during the cycle. A rank is generally a set of memory devices that respond to the same command and same address at the same time with different pieces of requested data. For example, with four (4) x8 memory devices arranged as a rank, one beat or cycle would read or write thirty-two (32) bits from the memory devices. In addition, the operation, e.g., read or write, may contain multiple beats. For example, an operation, e.g., read or write, may have a burst length (BL) of sixteen (BL 16), indicating sixteen (16) beats or cycles in the operation (transaction). In one example, a read operation of four (4) x8 memory devices arranged and configured for a burst length of sixteen (BL 16) would have sixteen (16) beats reading thirty-two (32) bits in each beat. In another example, an operation (read or write) in a DDR4 configuration having eight (8) x8 memory devices configured for a burst length of eight (BL 8), would have eight (8) beats accessing sixty-four (64) bits in each beat.

The memory subsystem may also include one or more memory control circuits 330, also known as Address Chips (AC), and one or more data buffer or data circuits (DC) 340, also known as DC chips. In other examples, the AC and DC chips may be combined into one chip. Alternatively, in one embodiment, the memory system may include one or more AC chips alone, without any DC chips, or one or more DC chip alone, without any AC chips. The memory control circuit 330 manages the flow of data going to and from, and access to the memory devices 350. The memory control circuit typically receives signals such as command and control signals from a host, e.g., a processor. The control signals may include address locations or tags on where to store data in the memory devices and/or data buffer circuits. The memory control circuit 330 may output command and control signals to the memory devices. The memory control circuits 330 for ease of reference may also be referred to as address and command circuits, AC circuits or AC chips. The memory control circuit 330 may or may not have a Registered Clock Driver (RCD) 332. Each memory module 325 may have one RCD 332 as shown in FIG. 3, or multiple RCDs 332 as shown in FIG. 4. The memory control circuit 330 in one embodiment may have a memory controller.

The memory control circuit 330 or memory controller may have a scheduler 338. The memory control circuit 330, memory controller, and/or scheduler 338 may optimize the order of operations and instructions, and sends out signals to the data buffer circuits and the memory devices. The memory control circuit 330/memory controller/memory scheduler 338 may reorder the sequence of operations. The memory control circuit 330 may or may not be located on the board or module, e.g., DIMM, with the memory devices. In embodiments, as shown in FIGS. 3 and 4, the memory control circuits 330 are formed as an integrated circuit or chip and are located on the module 325 with the memory devices 350. In the embodiment of FIG. 3, one memory control circuit 330 is on each DIMM 325 and controls and manages the memory devices 350 on the DIMM 325. In the embodiment of FIG. 4, two memory control circuits 330 with two RCDs 332 are shown on the module 325. It will be appreciated that one memory control circuit 330 and one or more RCDs 332 may be included on the memory modules 325. In particular, the memory module 325 in FIG. 4 may be configured to have one RCD 332.

The data buffer circuits 340 buffer, receive, transmit, and/or transfer data between the host, e.g., processor 302, and the memory devices 350. The data buffer circuits may also be referred to as data circuits, DC circuits, and/or DC chips. The data buffer circuits 340 may or may not be located on the same board or module, e.g., DIMM, as the memory devices and/or the memory control circuits. The data buffer circuits 340 in one embodiment are also formed as integrated circuits or chips and are located on the module 325 with the memory devices 350 as shown in FIG. 3. While not illustrated in FIG. 4, data buffer circuits may be located on the memory module and there may be one data buffer circuit for each memory device on the module, and/or one data buffer circuit for each memory device in a rank, and/or one data buffer circuit for each memory device in a channel. Other configurations are also contemplated.

The memory or data storage system 320 may be configured to store data and to provide storage services to one or more host, e.g., processors, which can be connected to the storage system 320 directly or through a network (e.g., over the internet). The storage system may include an interface for supporting communications with the host. For ease of illustration in FIGS. 3 and 4, the communication buses between the memory devices, memory control circuit and data buffer circuits have been eliminated.

In the memory system 320 of FIG. 3, each memory module 325 is configured as a DIMM and has one memory control circuit or AC chip 330, nine (9) data buffer circuits or DC chips 340, and thirty-six (36) memory devices 350, e.g., DRAMs (eighteen (18) memory devices 350 on each side). The memory control circuit 330 is configured and programmed to send command and control signals to the data buffer circuits 340 and the memory devices 350. Each memory control chip or AC chip 330 in this example manages the flow of data to and from the memory devices 350 on the module 325. Each data buffer circuit or DC chip 340 in this example interacts with and buffers data between four memory devices 350. The DIMMs may include a plurality of memory devices, e.g., DRAMs, which optionally may be arranged in groups or ranks of nine, e.g., 9, 18, 27, 36, etc., but other configurations are contemplated.

Other configurations are contemplated for the memory module 325, and for the memory subsystem 320. The memory system architecture may be formatted and structured to support DDR4 and DDR5 standards, and may include RDIMMs and LRDIMMs, although the methods, systems, and architecture disclosed and taught would be applicable to other configurations, including future standards.

FIG. 3 is consistent with DDR4 standards and includes eight (8) x8 memory devices for storing data and one x8 memory device for ECC, with sixty-four (64) bits of data being transferred per beat or cycle. That is, there are eight (8) x8 memory devices in a rank for data transfer with each memory device accessing eight (8) bits per cycle or beat for a total of sixty-four (64) bits of data accessed per cycle. If the width of the memory devices is four bits (x4 memory devices), then sixteen (16) x4 memory devices would be needed to access sixty-four (64) data bits per cycle, and two x4 memory devices to provide eight (8) bits of ECC to cover sixty-four (64) bits of data. It will be recognized that although the disclosure for ease of description refers to memory devices being specified for ECC, the ECC could be distributed across multiple memory devices.

FIG. 4 is consistent with DDR5 standards and the DIMM or memory module includes ten (10) memory devices arranged in two ranks/channels with four (4) x8 memory devices for storing data and one x8 memory device for ECC configured in a first rank (and channel), and four (4) x8 memory devices for storing data and one x8 memory device for ECC in a second rank (and channel). Each of the five (5) memory devices, e.g., DDR DRAMs, in each rank (and channel) has an eight (8) bit wide interface (x8) as illustrated in FIG. 4. The width of each rank and channel supports forty (40) bits and the data transferred is thirty-two (32) bits per cycle or beat. If 4 bit wide or 16 bit wide memory devices, e.g., x4 or x16 DRAMs, are used on the memory module, then the number of memory devices per rank and channel changes to meet the thirty-two (32) bit wide data transfer per cycle, and the corresponding ECC for each cycle or burst. For example, if four (4) bit wide memory devices (e.g., x4 memory devices) are used, then eight (8) x4 memory devices would be utilized for data and two (2) x4 memory devices would be used for ECC. And if sixteen (16) bit wide memory devices are used, then two (2) x16 memory devices would be used for data, and one x16 memory device would be used for ECC. In one example, in the alternative, two (2) x4 memory devices or one x8 memory device could be used for ECC since only seven (7) bits of ECC is necessary to cover thirty-two (32) bits of data.

The memory configuration in FIGS. 3-6, includes one x8 ECC memory device for each memory channel and/or rank. The number of ECC memory devices depends upon multiple factors, including but not limited to the type of error check and correction code (ECC) used and the amount of data being checked, and the number of data errors. The memory controller includes ECC logic which provides data correction for memory errors. The ECC logic uses conventional techniques. Generally, seven (7) bits are required for ECC to cover thirty-two (32) bits of data, and eight (8) bits are required for ECC to cover sixty-four (64) bits of data in a beat.

Figure 5:
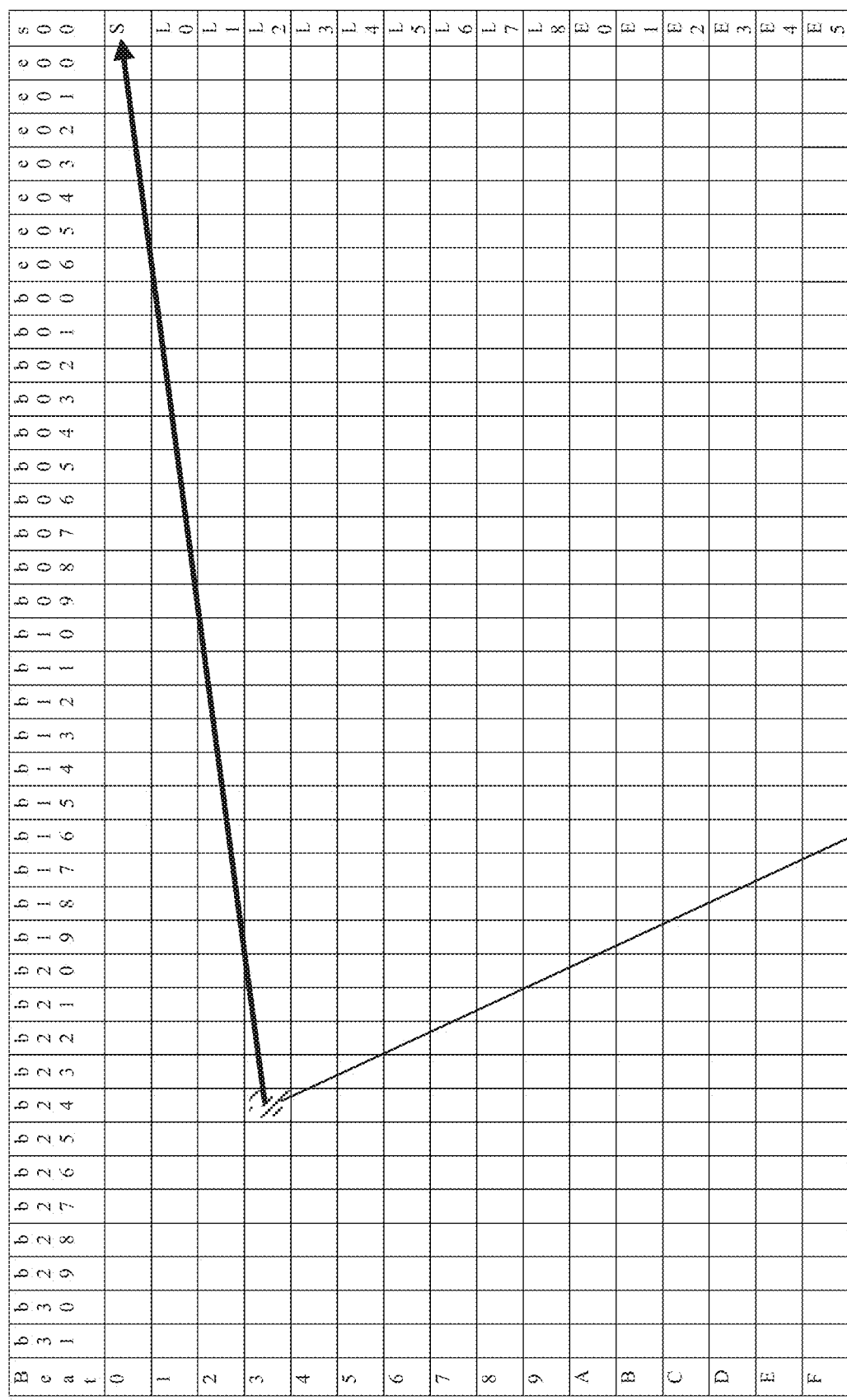
FIG. 5 depicts a diagrammatic representation of a bit failure in an operation that is rewritten to a spare bit lane in accordance with one embodiment.

FIG. 5 illustrates a rank of memory devices configured as shown in FIG. 4 where a bad or faulty data bit 121 is mapped to a spare bit lane. The column heading b00-b31 in FIG. 5 identifies thirty-two (32) bits of data being read in a cycle or beat, with the column heading e00-e06 identifying the seven (7) bits used for ECC in a cycle or beat. Since the data accessed per cycle or beat is thirty-two (32) bits, seven (7) bits are required in the rank (and channel in this illustration) to handle the ECC, so an additional x8 memory device is required for ECC. Thus, the rank and/or channel is forty (40) bits wide. More specifically, FIG. 5 illustrates a representation of the bits in an operation, e.g., read or write, in a rank of five (5) memory devices, each having an eight (8) bit wide data path, e.g., x8 memory device, where four (4) memory devices are associated and arranged as a rank (and channel) to store data, and one x8 memory device is used for ECC, where the system is configured for a burst length of sixteen (BL 16). It should be recognized by one skilled in the art that for ease of description the ECC is referred to and described as being on one memory device or chip, but the ECC is not limited to being on one memory device or chip, and the ECC could be distributed across multiple memory devices or chips.

Since thirty-two (32) bits of data are transferred in each cycle or beat and seven (7) bits are needed to cover ECC, one bit is leftover in a forty (40) bit wide rank/channel. That is, the channel has an extra bit left over that is not used for data or ECC in a beat or cycle. The column heading s00 in FIG. 5 illustrates the extra bit as a spare bit lane. The column heading "Beat" in FIG. 5 identifies the beat (number of the beat) in the burst operation, and in this example shows a burst length of sixteen (BL 16) in an operation, e.g., read or write, with the sixteen beats labeled in hexadecimal (0-9 and A-F). In FIG. 5, bit 121 is detected as faulty and is remapped to the spare bit lane s00. The value, information, or data intended for b121 in the burst (shown as bit b24 in beat 3) is written or remapped to bit S in spare bit lane s00. That is the value, information or data that was supposed to be written into bit 121 in the burst (e.g., bit b24 in beat 3) is now rewritten or mapped to bit S (bit s00 in beat 0). The location identifying the bad bit or error is written in bits L0-L8 in the spare bit lane s00. There are numerous ways of identifying the location of the faulty or erroneous bit, including referring to the bit number in the burst (e.g., bit 121) or by specifying the bit and beat number (e.g., bit b24 in beat 3). In the example of FIG. 5, the location of bit 121 (e.g., bit b24 in beat 3) is written into bits L8:L0 (L8:L0=0,0111,1001 S=b121 good value) in the spare bit lane s00.

In addition, ECC to cover the data and location of the faulty bit is also handled in the spare bit lane s00, shown as E0:E5 in FIG. 5. Thus, the bits in the spare bit lane s00 in beats A:F provide ECC coverage for the data bit S in beat 0 and the location information in bits L8:L0 in beats 1-9. Six (6) ECC bits can cover sixteen (16) bits of data/information in the spare bit lane s00. Thus, if a bad or faulty bit is detected, its value and location information is written to the spare bit lane s00. In subsequent operations, the memory controller uses the information/data in the spare bit S for the bad or faulty bit. The memory controller uses the information in the spare bit lane s00 at bits L8:L0 (e.g., bit s00 in beats 1-9) to identify the location of the bad bit and when/where to use the value from the spare bit S. In the example of FIG. 5, when reading bit 121, the memory controller uses the value in bit S. The memory controller uses the location information in bits L8:L0 in the spare bit lane s00 to know when/where to use the value, data or information located in bit S (bit s00 in 0 beat). Stated another way, when the memory controller accesses the memory device address identified by bits L8:L0 in the spare bit lane s00, the memory controller uses the data in bit S in the spare bit lane s00.

Figure 6:
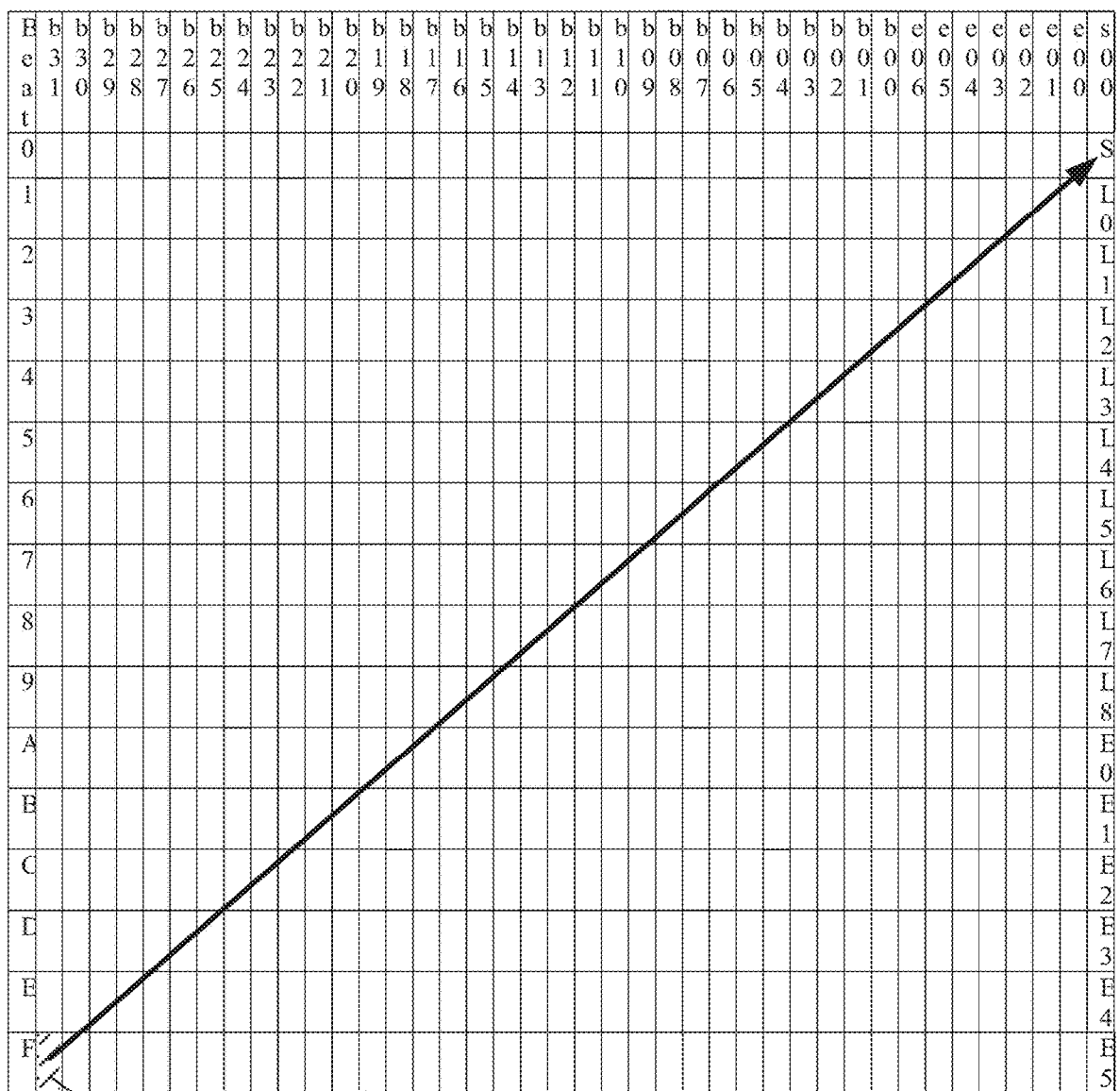
FIG. 6 depicts a diagrammatic representation of a different bit failure in a different, subsequent operation rewritten to a spare bit lane in accordance with an embodiment.

FIG. 6 illustrates another operation, for example, a read operation, in a sixteen (16) beat transaction. FIG. 6 is for a subsequent operation in a rank/channel arranged the same as FIG. 5 where b00-b31 represents data bits, e00-e06 represents ECC for the thirty-two (32) bits of data, and s00 represents the spare bit lane left over in a rank/channel having five (5) x8 memory devices (e.g., four x8 memory devices for data, and one x8 memory device for the seven (7) bits to cover ECC requirements). Each beat or cycle in an operation has a spare bit that is used to rewrite information from an error, e.g., a bad or faulty bit. FIG. 6 represents a bad bit 511 detected in a subsequent operation, which is rewritten to the spare bit lane s00, where the data, information or value intended for bit 511 is rewritten to bit S in the spare bit lane, the location information for the bad bit 511 is written in bits L0:L8 (L8:L0=1,111, 1111, S=b511 good value), and ECC coverage for bit S and location bits L8:L0 is provided by E0-E5 in the spare bit lane S00.

It will be appreciated that the bad or faulty bit, e.g., the error, rewritten to the spare bit lane s00 may be the same bit (location) in a different operation, or it may be a different bit (location) in a different operation. That is, the bit where the error occurs in the memory devices with each operation, can be the same bit, i.e., in the same location in the memory devices with each operation, or in a different bit, i.e., different location. The bad bit, no matter the location, can be rewritten and mapped to the spare bit lane in subsequent operations. It will also be appreciated that FIG. 5 and FIG. 6 are examples that may be applicable to a DDR5 BL 16 (Burst Length 16) operation having a thirty-two (32) bit wide data path (interface) with ECC coverage for the thirty-two (32) bits of data.

Other configurations that may provide one or more spare bit lanes may be utilized for the bit sparing system, architecture, and techniques disclosed herein. As one example, in a system or configuration where the two channels of FIG. 4 are locked or partnered such that ten (10) x8 memory devices are used for an operation having sixty-four (bits) of data for each beat or cycle, sixteen (16) bits are available for ECC memory to cover sixty-four (64) data bits. In this example, only eight (8) bits of ECC are required to cover sixty-four (64) bits of data, leaving a plurality of spare bit lanes for remapping or rewriting bad, faulty or erroneous bits. Other examples, may include adding extra devices. It will also be appreciated that while the examples in FIGS. 5 and 6 show x8 memory devices, the method and disclosure would have application to x4 or x16 memory devices.

Figure 7:
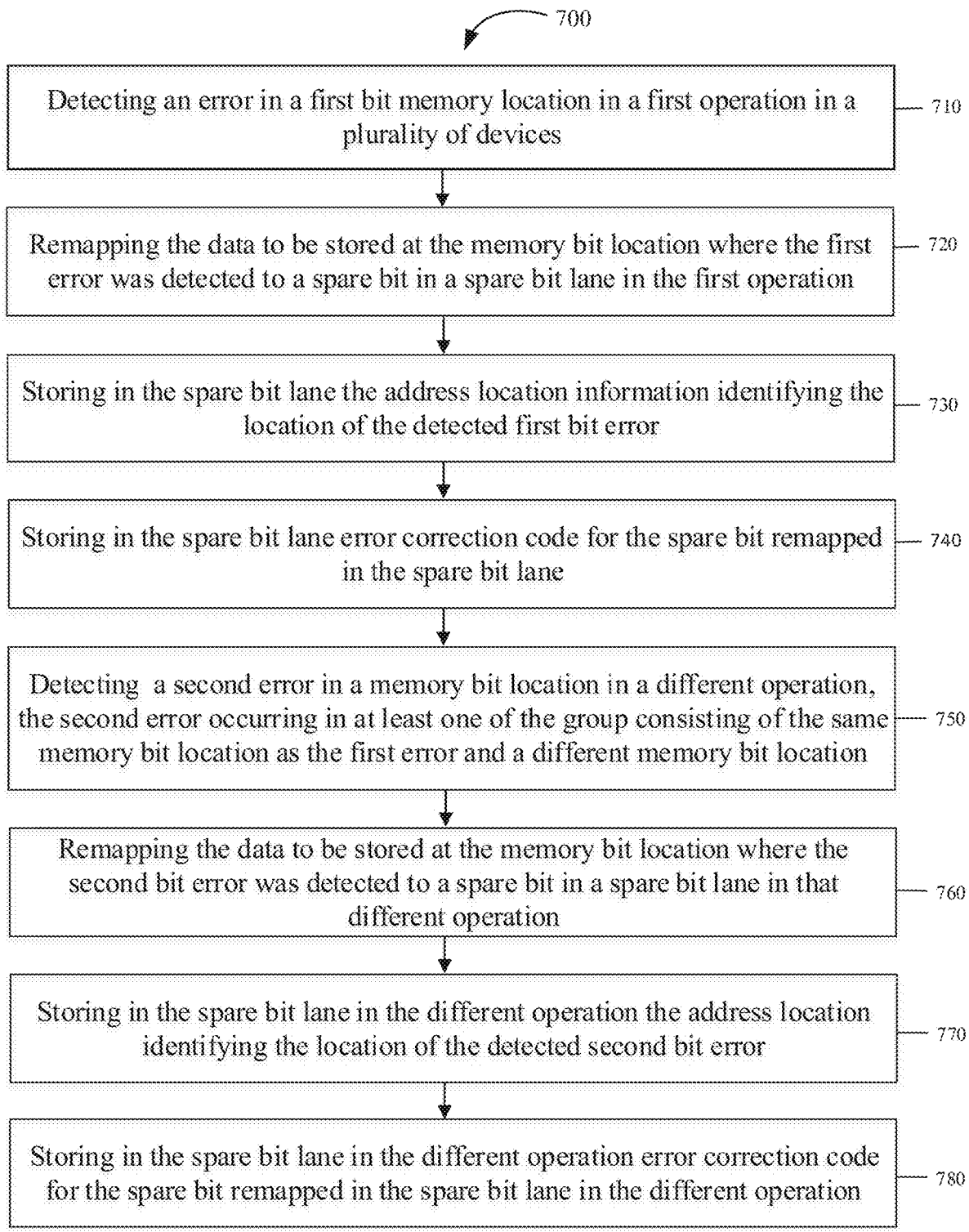
FIG. 7 is a flow diagram of a method of managing failed bits in a memory operation.

FIG. 7 is an exemplary flowchart in accordance with one embodiment illustrating and describing a method of managing bit errors in a memory system, including memory devices and/or memory modules, such as, for example DIMMs, in accordance with one embodiment of the present disclosure. While the method 700 is described for the sake of convenience and not with an intent of limiting the disclosure as comprising a series and/or a number of steps, it is to be understood that the process does not need to be performed as a series of steps and/or the steps do not need to be performed in the order shown and described with respect to FIG. 7, but the process may be integrated and/or one or more steps may be performed together, simultaneously, or the steps may be performed in the order disclosed or in an alternate order.

The method 700 of managing bit errors in a memory system includes at 710 detecting an error in a first bit memory location in an operation, e.g., read or write operation, in a plurality of memory devices, preferably associated, grouped or arranged as a rank. The plurality of memory devices may also be arranged as a channel as shown in FIG. 4. In one example, a detector circuit may be used to detect the bit error. The detector circuit may be part of the memory control circuit or memory controller. Alternatively, the detector circuit could be in other locations or part of other circuits in the system. One embodiment to detect errors would be to check the ECC code for a beat against data for that beat. ECC coding may permit single error correction and dual error detection (SECDED). If a bit is deleted as incorrect using ECC coding, that bit will be corrected and remapped to the spare lane. By sparing a bad bit, the algorithm allows for better coverage of the SECDED ECC code where a known bad bit is duplicated on the spare lane, the SECDED ECC coding does not need to correct that bad bit and may be used to correct other failing bits.

The data to be stored at the bit memory location where the first error was detected at 720 may be written to or remapped to a spare bit in a spare bit lane in the first operation. Logic to manage error response may be contained in the memory control circuit or memory controller. Logic to manage error response may be included in the detector or detector circuit. The address location information identifying the location of the detected first bit error may also be stored in the spare bit lane at 730. Error correction code for the information contained in the spare bit, and preferably for the location information identifying the faulty or detected bit error, at 740, may also be written to (stored in) the spare bit lane. In a subsequent operation, the memory controller will access, e.g., read, the value of the spare bit when it goes to access the bad bit, and will use the location information written to the spare bit lane in bits L8:L0 to identify the location of the bad bit. The method in one embodiment provides a sparing technique or process where data is moved from a faulty region of memory, e.g., a failed bit, and stored in a new memory location or region e.g., a spare bit, where subsequent accesses to that data will be retrieved from the new location and not the failed location.

In a second, different operation, subsequent to the first operation, a second error in a memory bit location may be detected at 750. The second error may occur at the same memory bit location as the first error or at a different memory bit location. The data to be stored at the memory bit location where the second bit error occurred, may be written or remapped at 760 to a spare bit in a spare bit lane in that operation.

The location of the second bit error may be stored at 770 in the spare bit lane during that second, different operation. Error correction code for the spare bit, remapped in the spare bit lane in the second, different operation, and preferably for the location identifying the faulty or detected error bit, may also be stored in the spare bit lane at 780. In a subsequent operation, the memory controller will access, e.g., read the value of the spare bit when it goes to read the bad bit, and will use the location information written to the spare bit lane in bits L8:L0 to identify the location of the bad bit.

It will be appreciated that the system, architecture and process disclosed may be used where there are multiple bit failures in a given beat (a row as shown in the example figures) as the spare bit lane can be used to handle one or more multiple bit failures in the beat.

A memory system for storing data is disclosed, the memory system includes a plurality of memory devices configured to store data, each memory device having a plurality of bits, the memory devices configured and associated to work together as a rank to respond to a request; a memory control circuit associated with the plurality of memory devices and configured to output command and control signals to the plurality of memory devices; a detector for detecting a bit error in an operation; and a controller for remapping the bit error to a spare bit lane in response to the detector detecting the bit error. In one aspect, the detector, controller, and memory control circuit are on the same chip. The plurality of memory devices may be on a dual inline memory module (DIMM) and the memory control circuit is on the DIMM. The DIMM in one embodiment may further include data buffer circuits.

The system in one aspect may include at least one DIMM that includes a plurality of memory devices, e.g., at least ten (10) memory devices, wherein five (5) memory devices form a first rank and five (5) memory devices form a second rank, and further wherein thirty two (32) bits per rank are used to store data. In one embodiment, seven (7) bits per rank are used for error correction code and at least one bit is used for remapping an error. In accordance with one embodiment, the five memory devices of the first rank form a channel that is forty bits wide. The information rewritten to the spare bit (and/or spare bit lane) may include the data of the bit where the error was detected, the location of the bit (e.g., the bit number in the burst, or the bit number in the beat and the beat number) where the error was detected, and error correction code for the spare bit and the location of the bit where the error was detected.

In one aspect, the plurality of memory devices provide a plurality of spare bit lanes to remap bit errors. The memory control circuit in one embodiment may be configured to read the data in the spare bit in the spare bit lane, and the location information in the spare bit lane to identify the bit to use the data held in the spare bit in the spare bit lane.

In another embodiment, a memory system for storing data is disclosed, the memory system comprising a plurality of memory devices configured to store data, each memory device having a plurality of bits, the memory devices configured and associated to work together as a rank to perform an operation and a memory control circuit associated with the plurality of memory devices configured as a rank, and configured to output signals to the plurality of memory devices, the memory control circuit containing logic circuits configured to (i) detect a failing bit during an operation; (ii) rewrite the data from the failing bit in the operation to a single spare bit lane; and (iii) read the data rewritten to the spare bit lane for the failing bit. The memory control circuit may include a memory controller configured to write the location address of the failing bit to the spare bit lane, and in a further aspect, may further include ECC for the data and location information written to the spare bit lane.

In yet another embodiment, a method for managing bit errors in a memory subsystem is disclosed, the method including detecting an error in a first memory bit location in a plurality of memory devices in a first operation; and remapping the data to be stored at the memory bit location where the first error was detected to a spare bit lane. In one aspect of the method, the data to be stored in the memory bit location where the first error was detected is remapped to a spare bit in the spare bit lane. The remapping may include storing location information identifying the location of the detected bit error and error correction code for the spare bit in the spare bit lane. A single error in a first operation may be written to a single bit lane. In one aspect, the first operation is a read operation and if an error is detected during the read operation, the method further comprises performing a write operation wherein the system, preferably the memory controller, writes the information/data from the bit location where the error was detected into the spare bit lane. In another aspect, the method includes a read operation and valid data is read from the spare bit lane that includes one bit of data, one or more bits of location information for the bit of data, and one or more bits of error correction code protecting the data bit and the location bits. In another aspect, the method includes a read operation and valid data is read from the spare bit lane that includes one spare bit where that bit is remapped into the read data by the system, preferably the memory controller, using location information stored in the spare bit lane to reconstruct the original non-spared data.

The method may in embodiments further include detecting a second error in a bit memory location in a different operation, the second error occurring in at least one of the group consisting of the same memory bit location as the first bit error and a different memory bit location; and remapping the data to be stored at the memory bit location where the second error was detected to a single spare bit lane in that different operation. The method in one aspect may include a memory rank having a plurality of memory devices, e.g., five (5) memory devices, wherein thirty-two (32) bits are configured to store data, and seven (7) bits are for error correction code, and one bit is to manage and/or remap errors.

In yet another embodiment, a computer program product for managing errors in a memory system is disclosed, the computer program product comprising a computer readable storage medium having program instructions embodied therewith, the program instructions executable by a memory system to cause the memory system to perform a method, the memory system comprising a memory control circuit and a plurality of memory devices, the method comprising detecting an error in a first memory bit in the plurality of memory devices and remapping the data from the memory bit where the first error was detected to a spare bit lane.

While the illustrative embodiments described above are preferably implemented in hardware, such as in functional units of a processor, various aspects of the illustrative embodiments may be implemented in software as well. For example, it will be understood that each block of the flowchart illustration in FIG. 7, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks. Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A non-transitory computer readable medium comprising instructions that when executed configure a memory system to:
   detect a first error in a first memory bit location in at least one memory storage device;
   remap and store data to be stored at the first memory bit location where the first error was detected to a spare bit lane; and
   store location information in the spare bit lane that identifies at least one of: a location of the first error, an error correction code (ECC), or a combination thereof.

2. The non-transitory computer readable medium of claim 1, further comprising instructions that when executed configure the memory system to: read, after detecting the first error and after remapping the data to the spare bit lane, the data remapped to the spare bit lane.

3. The non-transitory computer readable medium of claim 1, further comprising instructions that when executed configure the memory system to remap and store data to be stored at the first memory bit location where the first error was detected to a single spare bit in the spare bit lane.

4. The non-transitory computer readable medium of claim 1, further comprising instructions that when executed configure the memory system to write data associated with a single error in a first operation to a single bit lane.

5. The non-transitory computer readable medium of claim 1, wherein the first error in the first memory bit location in the at least one memory storage device is detected in a read operation, and the non-transitory computer readable medium further comprises instructions that when executed configure the memory system to: perform a write operation that writes the data stored in the spare bit lane to a memory bit location identified by location information contained in the spare bit lane.

6. The non-transitory computer readable medium of claim 1, wherein the data remapped and stored in the spare bit lane comprises at least a bit of data and one or more bits of location information for said bit of data.

7. The non-transitory computer readable medium of claim 6, wherein the data remapped and stored in the spare bit lane further comprises one or more bits of error correction code protecting said bit of data and said one or more bits of location information.

8. The non-transitory computer readable medium of claim 1, further comprising instructions that when executed configure the memory system to:
   detect a second error in a bit memory location in a different operation, the second error occurring in a second memory bit location in at least one of a group consisting of a same memory bit location as the first error and a different memory bit location; and
   remap data to be stored at the second memory bit location where the second error was detected to a single spare bit lane in the different operation.

9. The non-transitory computer readable medium of claim 1, further comprising instructions that when executed configure the memory system to:
   read data remapped and stored in a spare bit lane in the at least one memory storage device; and
   read location information in the spare bit lane to identify where to use the data read from the spare bit lane.

10. A method for storing electronic data, the method comprising:
    reading spare bit lane data in a spare bit lane in a memory storage device configured to store the electronic data, wherein the memory storage device has a plurality of spare bits configured in the spare bit lane for remapping one or more bit errors detected during an operation; and
    reading a location address in the spare bit lane to identify where to use the spare bit lane data read from the spare bit lane.

11. The method of claim 10, further comprising: detecting a bit error during an operation in the memory storage device, and remapping and storing, in response to detecting the bit error, the spare bit lane data from the location address of the bit error to the spare bit lane.

12. The method of claim 11, further comprising using an error correction code (ECC) for the electronic data stored in the memory storage device and the location address of the bit error written to the spare bit lane.

13. The method of claim 10, further comprising: writing the location address of the bit error to the spare bit lane.

14. The method of claim 10, further comprising: detecting a bit error during an operation in the memory storage device and remapping and storing information to the spare bit lane.

15. The method of claim 14, wherein the information remapped and stored in the spare bit lane comprises at least a bit of the electronic data and one or more bits of location information for said bit of the electronic data.

16. The method of claim 15, wherein the information remapped and stored in the spare bit lane further comprises one or more bits of error correction code protecting said bit of the electronic data and said one or more bits of the location information.

17. A non-transitory computer readable medium comprising instructions that when executed configure a memory system to:
    read spare bit lane data in a spare bit lane in a memory storage device configured to store data, wherein the memory storage device has a plurality of spare bits configured in the spare bit lane for remapping a bit error detected during an operation; and
    read a location address in the spare bit lane to identify where to use the spare bit lane data read from the spare bit lane.

18. The non-transitory computer readable medium of claim 17, further comprising instructions that when executed configure the memory system to:
   detect a bit error during an operation in the memory storage device; and
   remap and store, in response to detecting the bit error, the data from a location address of the bit error to the spare bit lane.

19. The non-transitory computer readable medium of claim 17, further comprising instructions that when executed configure the memory system to: write the location address of the bit error to the spare bit lane.

\* \* \* \* \*